(12) United States Patent
Rinne (10) Patent No.: US 7,755,164 B1
(45) Date of Patent: Jul. 13, 2010

(54) CAPACITOR AND RESISTOR HAVING ANODIC METAL AND ANODIC METAL OXIDE STRUCTURE

(75) Inventor: Glenn A. Rinne, Apex, NC (US)

(73) Assignee: Amkor Technology, Inc., Chandler, AZ (US)

( * ) Notice: Subject to any disclaimer, the term of this patent is extended or adjusted under 35 U.S.C. 154(b) by 1017 days.

(21) Appl. No.: 11/472,874

(22) Filed: Jun. 21, 2006

(51) Int. Cl.
*H01L 27/01* (2006.01)
(52) U.S. Cl. .................. 257/532; 257/531; 257/537; 257/E27.116
(58) Field of Classification Search ......... 257/531–533, 257/384, 393, 528, 536, 537, E21.004, E21.006, 257/E21.009, E21.011, E21.022, E27.116; 361/821
See application file for complete search history.

(56) References Cited

U.S. PATENT DOCUMENTS

| | | | | |
|---|---|---|---|---|
| 3,862,017 | A * | 1/1975 | Tsunemitsu et al. | 205/124 |
| 4,458,295 | A * | 7/1984 | Durschlag et al. | 361/322 |
| 6,075,691 | A * | 6/2000 | Duenas et al. | 361/321.5 |
| 6,194,250 | B1 | 2/2001 | Melton et al. | |
| 6,635,949 | B2 * | 10/2003 | Lowther et al. | 257/531 |
| 6,730,857 | B2 | 5/2004 | Konrad et al. | |
| 6,740,964 | B2 | 5/2004 | Sasaki | |
| 6,919,514 | B2 | 7/2005 | Konrad et al. | |
| 7,005,722 | B2 * | 2/2006 | Schaper et al. | 257/533 |
| 7,242,081 | B1 | 7/2007 | Lee | |
| 7,345,361 | B2 | 3/2008 | Mallik et al. | |
| 7,372,151 | B1 | 5/2008 | Fan et al. | |
| 2002/0089810 | A1 * | 7/2002 | Casper et al. | 361/306.3 |
| 2005/0272216 | A1 * | 12/2005 | Remmel et al. | 438/381 |
| 2006/0205170 | A1 | 9/2006 | Rinne | |
| 2006/0217102 | A1 * | 9/2006 | Degani et al. | 455/333 |
| 2007/0273049 | A1 | 11/2007 | Khan et al. | |
| 2007/0290376 | A1 | 12/2007 | Zhao et al. | |
| 2008/0230887 | A1 | 9/2008 | Sun et al. | |

OTHER PUBLICATIONS

Berry et al., "Thin Stacked Interposer Package", U.S. Appl. No. 11/865,617, filed Oct. 1, 2007.
Scanlan, "Package-on-package (PoP) with Through-mold Vias", *Advanced Packaging*, Jan. 2008, 3 pages, vol. 17, Issue 1, PennWell Corporation.
Kim et al., "Application of Through Mold Via (TMV) as PoP base package", *58th ECTC Proceedings*, May 2008, Lake Buena Vista, FL, 6 pages, IEEE.

(Continued)

*Primary Examiner*—Matthew C Landau
*Assistant Examiner*—Daren Wolverton
(74) *Attorney, Agent, or Firm*—Gunnison, McKay & Hodgson, L.L.P.; Serge J. Hodgson (57) ABSTRACT

An anodic metal layer, e.g., a tantalum layer, is deposited. An anodization mask is formed, the anodization mask exposing first portions of the tantalum layer and covering second portions of the tantalum layer. The exposed first portions of the tantalum layer are anodized to form a tantalum pentoxide layer. The amount of the tantalum layer converted to the tantalum pentoxide layer is precisely controlled by the applied anodization potential. Accordingly, the thicknesses of the remaining tantalum layer and the formed tantalum pentoxide layer are precisely controlled allowing the values of passive devices, e.g., resistors and capacitors, formed with the tantalum layer and/or the tantalum pentoxide layer to be precisely set.

19 Claims, 8 Drawing Sheets

OTHER PUBLICATIONS

Lee et al., "Effects of Postannealing on Current-Voltage Characteristics of Metal-Insulator($Ta_2O_5$) -Metal Type Thin-Film Diodes", *Journal of the Korean Physical Society*, vol. 39, No. 4, Oct. 2001, pp. 686-691.

Yamada et al., "An Etching Mechanism of Ta by Chlorine-Based Plasmas", 1990, Fujitsu Limited, Japan, pp. 1-4.

Chung et al., "Anodically Grown $TiO_2$ Thin-Films: Structure and Dielectric Properties", Cleveland, OH, 1 page.

Beyne et al., "High density interconnect substrates using multilayer thin film technology on laminate substrates (MCM-SL/D)", IMEC, Belgium, pp. 1-6.

Kim et al. "Study of the Etching Mechanism of Tantalum Thin Films by Argon Actinometry", *Journal of the Korean Physical Society*, vol. 40, No. 1, Jan. 2002, pp. 160-162.

Golan et al., "Novel approach to sputtered tantalum film resistors with controlled pre-defined resistance", *Microelectronics Journal 32*, Elsevier Science Ltd, 2000, pp. 61-67.

* cited by examiner

CAPACITOR AND RESISTOR HAVING ANODIC METAL AND ANODIC METAL OXIDE STRUCTURE

BACKGROUND OF THE INVENTION

1. Field of the Invention

The present invention relates generally to electronic components. More particularly, the present invention relates to a passive device structure and method for fabricating the same.

2. Description of the Related Art

To decrease electronic component size, passive devices, e.g., inductors, resistors, and capacitors, are being integrated into the top metal/dielectric layers of integrated circuit chips. As the feature size of these passive devices is small, small variations in manufacturing result in substantial variation in the values of the passive devices.

To illustrate, small variations in the thickness of the conductive layer of a resistor results in a large variation in the sheet resistance of the resistor. As another example, small variations in the thickness of the dielectric layer of a capacitor results in a large variation in the Q value of the capacitor. These variations in the values of the passive devices may be unacceptable depending upon the application.

SUMMARY OF THE INVENTION

In accordance with one embodiment, an anodic metal layer such as an aluminum layer, a niobium layer, a titanium layer, a tungsten layer, a zirconium layer or a tantalum layer is formed.

In one specific example, a tantalum layer is deposited. An anodization mask is formed, the anodization mask exposing first portions of the tantalum layer and covering second portion of the tantalum layer. The exposed first portions of the tantalum layer are anodized to form a tantalum pentoxide layer. The amount of the tantalum layer converted to the tantalum pentoxide layer is precisely controlled by the applied anodization potential. Accordingly, the thicknesses of the remaining tantalum layer and the formed tantalum pentoxide layer are precisely controlled allowing the values of passive devices, e.g., resistors and capacitors, formed with the tantalum layer and/or the tantalum pentoxide layer to be precisely set.

Further, the tantalum pentoxide layer is used as an etch mask for removal of portions of the tantalum layer. By using the tantalum pentoxide layer as an etch mask, formation of an additional etch mask, e.g., from photoresist, is avoided. This simplifies manufacturing and minimizes the manufacturing cost of the passive device structure.

These and other features of the present invention will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

In accordance with one embodiment, an anodic metal layer such as an aluminum layer, a niobium layer, a titanium layer, a tungsten layer, a zirconium layer or a tantalum layer is formed.

Figure 6:
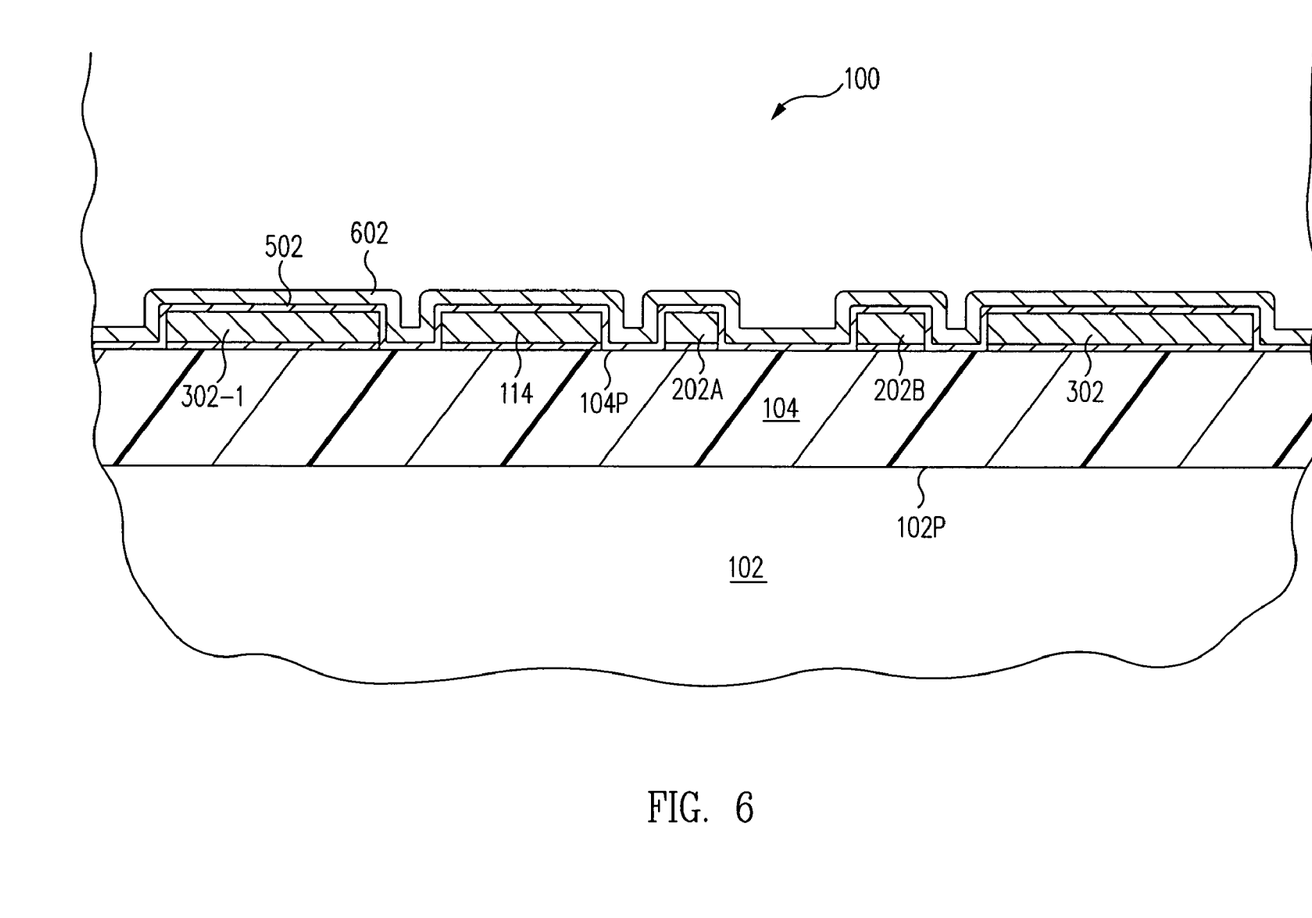
Figure 7:
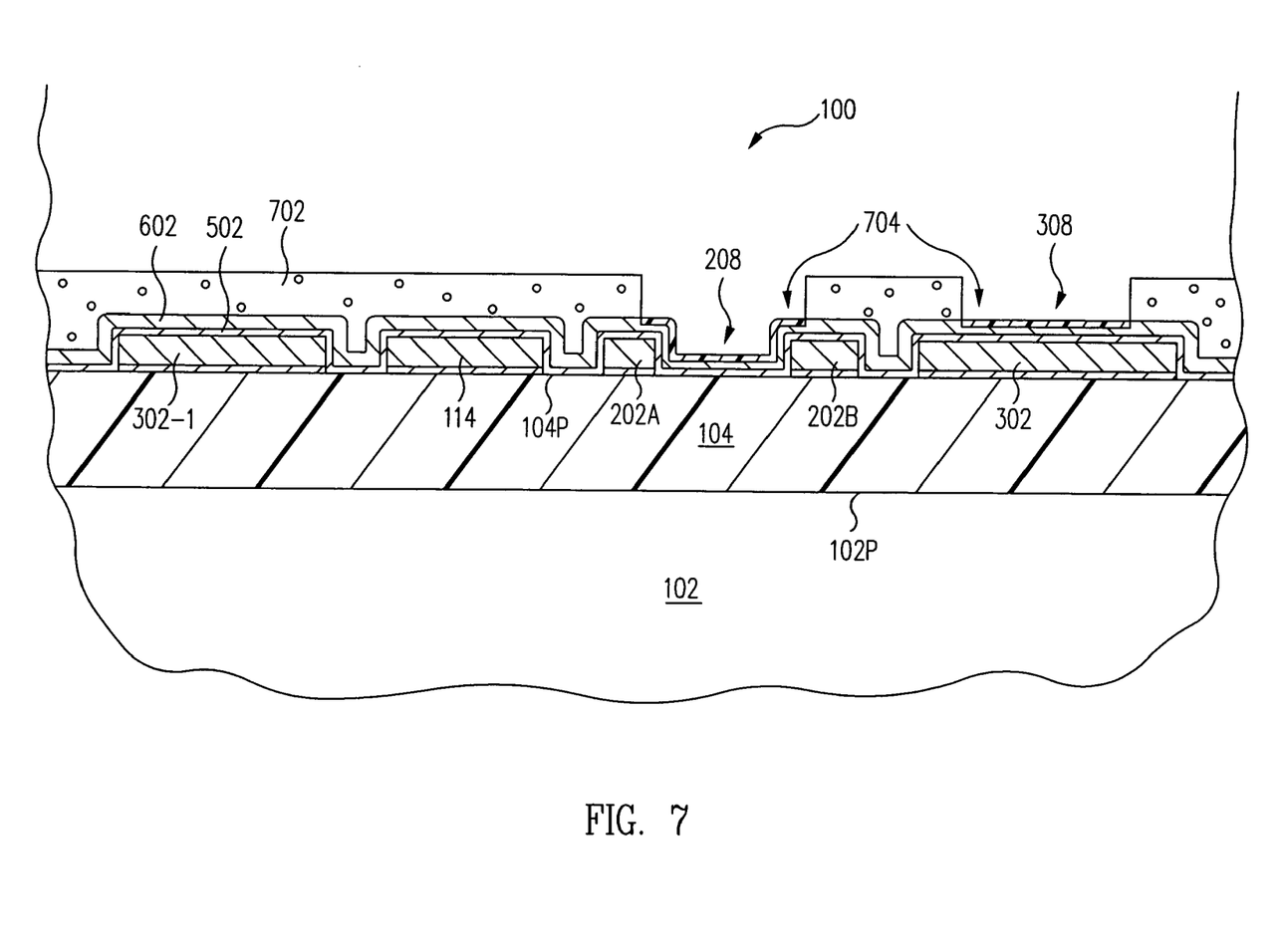

In one specific example, referring to FIG. 6, a tantalum layer 602 is deposited. Referring now to FIG. 7, an anodization mask 702 is formed, anodization mask 702 exposing first portions of tantalum layer 602 and covering second portion of tantalum layer 602. The exposed first portions of tantalum layer 602 are anodized to form a tantalum pentoxide layer 704. The amount of tantalum layer 602 converted to tantalum pentoxide layer 704 is precisely controlled by the applied anodization potential. Accordingly, the thicknesses of the remaining tantalum layer 602 and formed tantalum pentoxide layer 704 are precisely controlled allowing the values of passive devices, e.g., resistors and capacitors, formed with tantalum layer 602 and/or tantalum pentoxide layer 704 to be precisely set.

Figure 8:
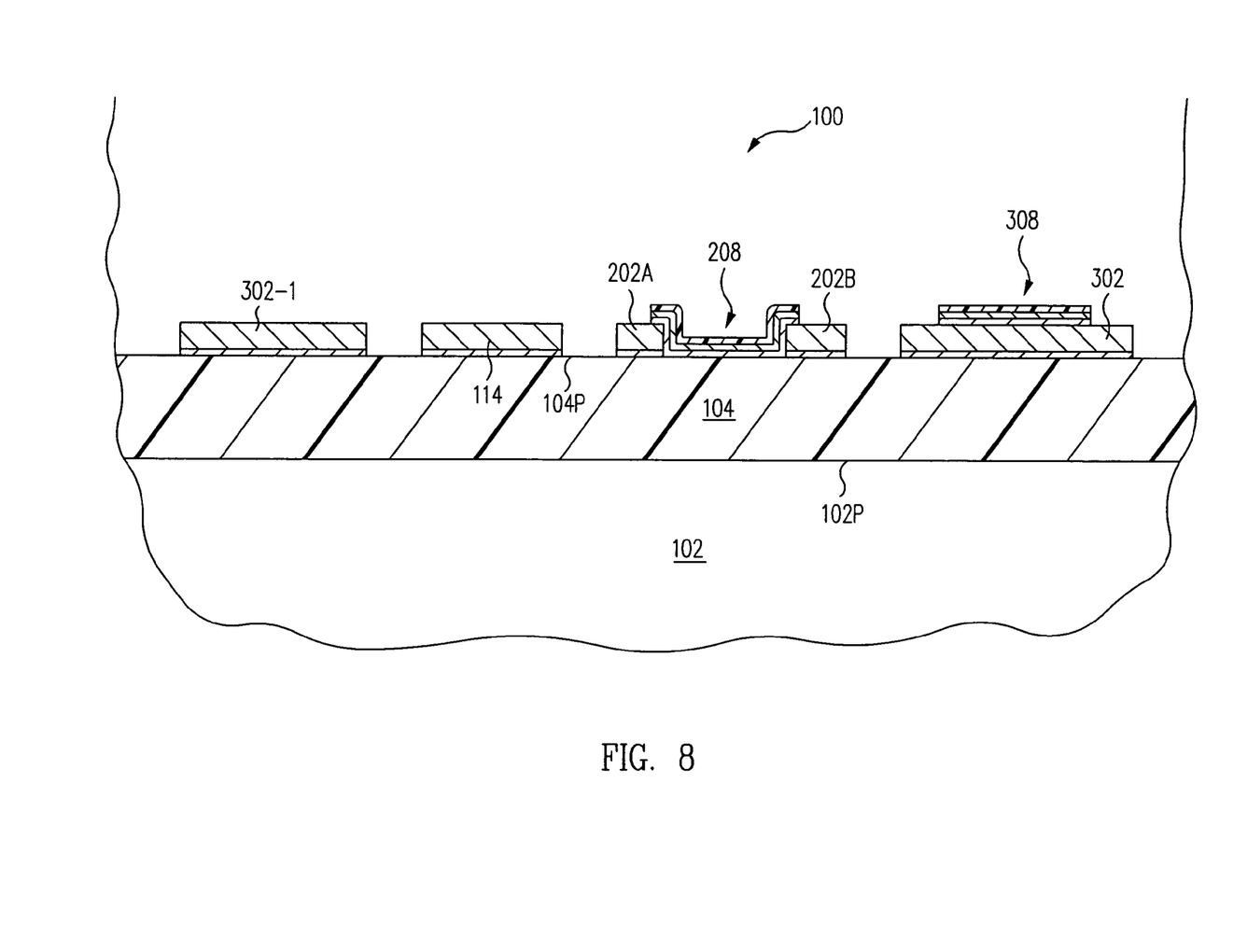

Further, referring to FIGS. 7 and 8 together, tantalum pentoxide layer 704 is used as an etch mask for removal of portions of tantalum layer 602. By using tantalum pentoxide layer 704 as an etch mask, formation of an additional etch mask, e.g., from photoresist, is avoided. This simplifies manufacturing and minimizes the manufacturing cost of passive device structure 100.

Figure 1:
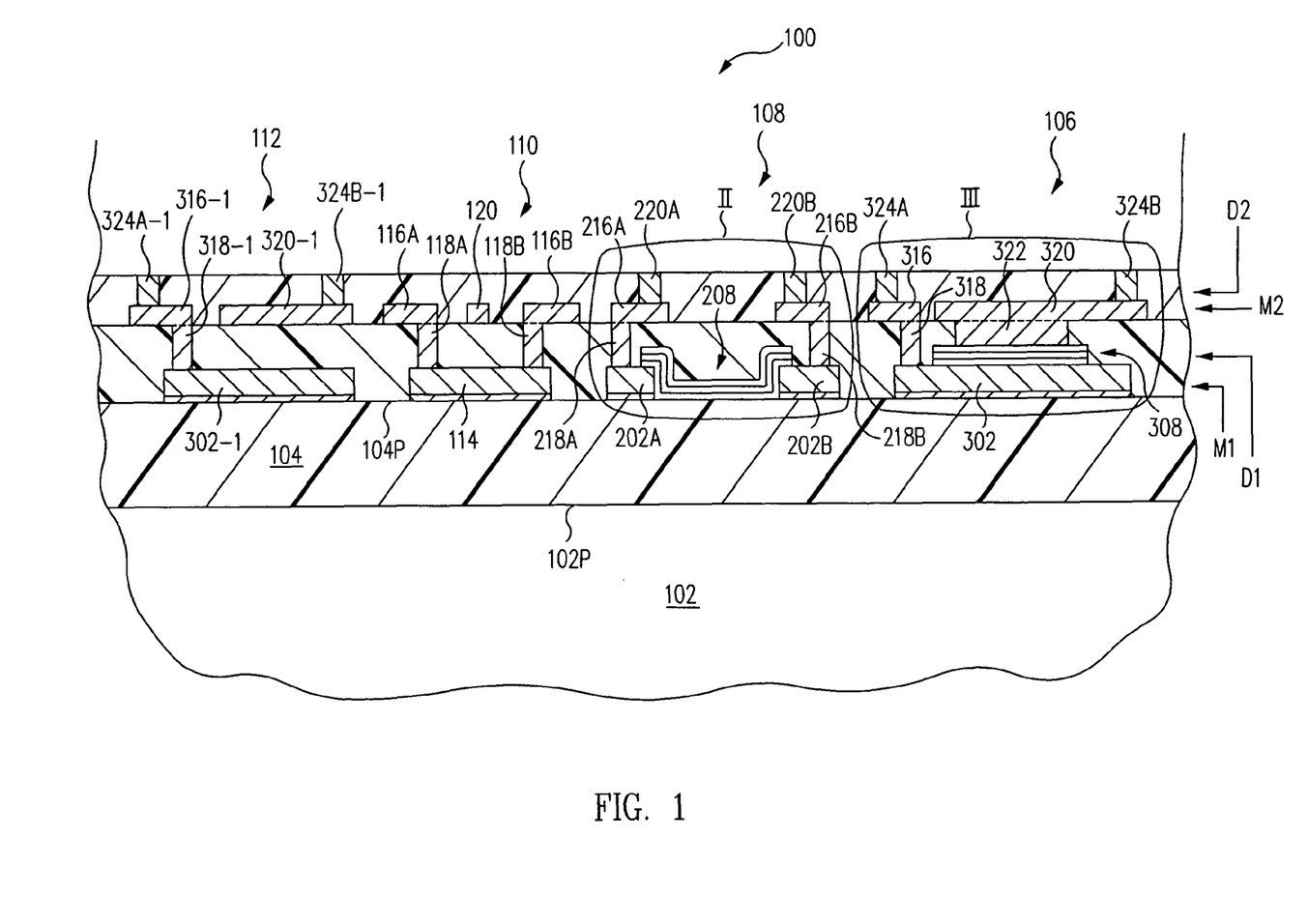
FIG. 1 is a cross-sectional view of a passive device structure in accordance with one embodiment of the present invention.

More particularly, FIG. 1 is a cross-sectional view of a passive device structure 100 in accordance with one embodiment of the present invention. Passive device structure 100 includes a substrate 102, e.g., a silicon wafer, a printed circuit board (PCB), a flex circuit, etc., having a principal surface 102P. Formed on principal surface 102P is a principal dielectric layer 104 having a principal surface 104P.

Formed on principal dielectric layer 104 is a first capacitor 106, a first resistor 108, a first inductor 110, and a second capacitor 112, collectively called passive devices 106-112. As discussed further below, passive devices 106-112 are formed from portions of a first metal layer M1, a first primary dielectric layer D1, a second metal layer M2, and a second primary dielectric layer D2. As discussed further below and illustrated, first metal layer M1 is a metal bilayer structure in accordance with this embodiment although it is a single layer, sometimes called a monolayer, in another embodiment.

Figure 2:
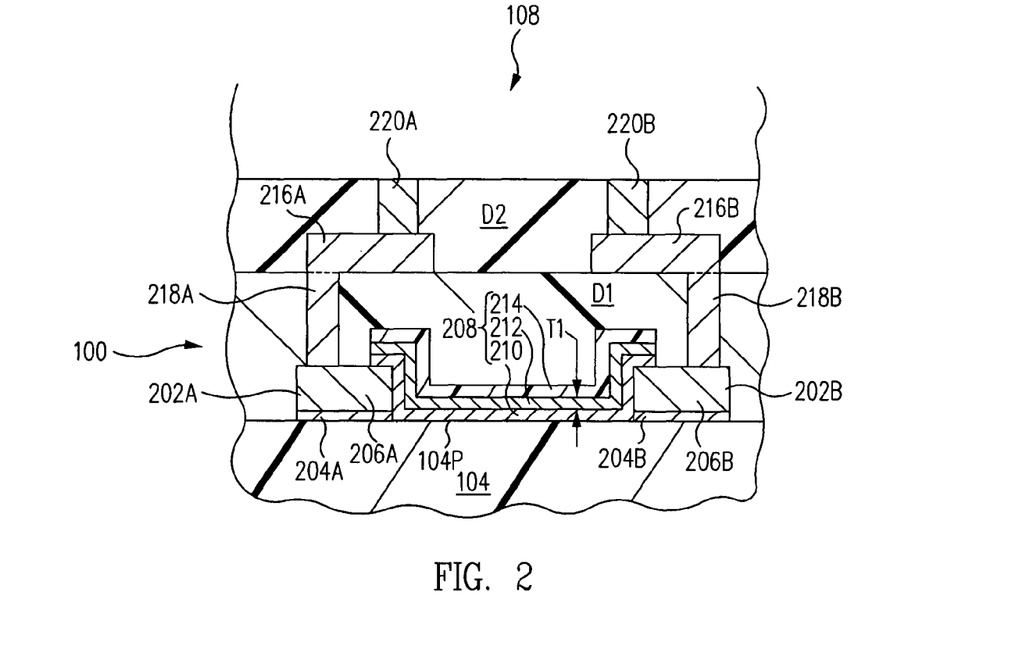
FIG. 2 is an enlarged cross-sectional view of the region II including a resistor of the passive device structure of FIG. 1 in accordance with one embodiment of the present invention.

FIG. 2 is an enlarged cross-sectional view of the region II including resistor 108, e.g., a low range resistor, of passive device structure 100 of FIG. 1 in accordance with one embodiment of the present invention. Referring now to FIGS. 1 and 2 together, resistor 108 includes a first terminal 202A and a second terminal 202B, i.e., portions of first metal layer M1. More particularly, terminals 202A, 202B, collectively terminals 202, are electrically conductive and formed directly on principal surface 104P of principal dielectric layer 104 in accordance with this embodiment.

Terminals 202 are a metal bilayer structure. To illustrate, referring to terminal 202A, terminal 202A includes a lower, e.g., first, metal layer 204A and an upper, e.g., second, metal layer 206A. Illustratively, lower metal layer 204A is formed directly on principal surface 104P of principal dielectric layer 104 and upper metal layer 206A is formed directly on lower metal layer 204A.

For example, lower metal layer 204A is formed of titanium and upper metal layer 206A is formed of copper. In accordance with this example, lower metal layer 204A improves adhesion of upper metal layer 206A to principal dielectric layer 104. Further, lower metal layer 204A getters oxygen and prevents migration of the copper of upper metal layer 206A into principal dielectric layer 104.

In other examples, lower metal layer 204A is formed of other materials. For example, lower metal layer 204A is formed of titanium tungsten (TiW). In another example, lower metal layer 204A is formed of a metal stack such as a titanium nitride/aluminum (TiN/Al) or titanium/copper (Ti/Cu) bilayer.

However, in another embodiment, lower metal layer 204A is not formed. In accordance with this example, upper metal layer 206A is formed directly on principal dielectric layer 104.

Terminal 202B includes lower and upper metal layers 204B, 206B similar to lower and upper metal layers 204A, 206A of terminal 202A and so are not discussed in detail.

Extending horizontally between and electrically connected to terminals 202 is a resistive structure 208. In accordance with this embodiment, resistive structure 208 is a trilayer structure including a lower metal layer 210, a middle metal layer 212 on lower metal layer 210, and an upper dielectric layer 214 on middle metal layer 212.

Lower metal layer 210, sometimes called a high value metal layer or a conductive layer, is titanium or titanium tungsten in accordance with one embodiment. For simplicity of discussion, lower metal layer 210 is hereinafter referred to as titanium layer 210. Titanium layer 210 promote adhesion of middle metal layer 212 to contacts 202 and principal dielectric layer 104.

Middle metal layer 212, sometimes called a low value metal layer, a conductive layer or an anodic metal layer, is an anodic metal, e.g., aluminum, niobium, titanium, tungsten, zirconium or tantalum in accordance with one embodiment. In one specific example, middle metal layer 212 is tantalum.

For simplicity of discussion, middle metal layer 212 is hereinafter referred to as tantalum layer 212. Tantalum layer 212 sets the sheet resistance of resistive structure 208 and thus the value of resistor 108. More particularly, the thickness T1 of tantalum layer 212 sets the sheet resistance of resistive structure 208 and thus the value of resistor 108.

Upper dielectric layer 214 is a metal oxide of the anodic metal of middle metal layer 212, e.g., is aluminum oxide (e.g., $Al_2O_3$), niobium oxide (e.g., $Nb_2O_5$, sometimes called niobium pentoxide), titanium oxide (e.g., $TiO_2$, sometimes called titanium dioxide), tungstic oxide (e.g., $WO_3$, sometimes called tungsten oxide), zirconium oxide (e.g., $ZrO_2$), tantalum oxide (e.g., $Ta_2O_5$, sometimes called tantalum pentoxide). In one specific example, upper dielectric layer 214 is tantalum pentoxide.

For simplicity of discussion, upper dielectric layer 214 is hereinafter referred to as tantalum pentoxide layer 214. Tantalum pentoxide is a dielectric and thus tantalum pentoxide layer 214 has little effect on the value of resistor 108 except to the extent that tantalum pentoxide layer 214 represents the amount of tantalum layer 212 converted into tantalum pentoxide. Generally, tantalum layer 212 is formed of a metal, e.g., tantalum, and tantalum pentoxide layer 214 is formed of a metal oxide of the metal of tantalum layer 212, e.g., tantalum pentoxide.

As set forth further below, the amount of tantalum layer 212 converted to tantalum pentoxide layer 214 is precisely controlled by the applied anodization potential. Accordingly, thickness T1 of tantalum layer 212 is precisely controlled allowing the value of resistor 108 to be precisely set. Further, the tolerance in the value of resistor 108 is minimal.

In one embodiment, resistor 108 is a low range resistor that uses tantalum layer 212 as the resistor. Sheet resistances for tantalum layer 212 depend upon the thickness of tantalum layer 212, and in one example, fall in the range of 2-5 ohms/☐ (ohms/square). In one example, resistor 108 is in the range of 5-10 squares and so resistor 108 has a value in the range of 10-50 ohms in accordance with this example.

In another embodiment, resistive structure 208 is a bilayer structure. For example, titanium layer 210 is not formed and tantalum layer 212 is directly formed on principal dielectric layer 104.

In another example, all of the tantalum is oxidized to tantalum pentoxide and accordingly resistive structure 208 is formed without tantalum layer 212. Thus, tantalum pentoxide layer 214 is formed directly on titanium layer 210.

Resistor 108 is a high range resistor in accordance with this bilayer example. Resistor 108 uses titanium layer 210 as the sole conductive layer, i.e., the resistor. Sheet resistances for titanium layer 210 depend upon the thickness of titanium layer 210, and in one example, fall in the range of 5-20 ohms/☐ (ohms/square). In one example, resistor 108 is in the range of 5-10 squares and so resistor 108 has a value in the range of 25-200 ohms in accordance with this example.

Contacts 202 and resistive structure 208 are enclosed in and covered by first primary dielectric layer D1. Electrically conductive traces 216A, 216B are formed on first primary dielectric layer D1. Traces 216A, 216B, collectively traces 216, are portions of second metal layer M2.

Electrically conductive vias 218A, 218B extend through first primary dielectric layer D1 between contacts 202A, 202B and traces 216A, 216B, respectively. Accordingly, vias 218A, 218B electrically connect contacts 202A, 202B and traces 216A, 216B, respectively.

Although various features are described herein as being separate pieces connected together, in other embodiments, the elements are integral, i.e., are a single piece and not a plurality of separate pieces connected together. To illustrate, trace 216A and via 218A are integral in one embodiment.

Formed on first primary dielectric layer D1 and covering second metal layer M2 including traces 216 is second primary dielectric layer D2. Electrically conductive vias 220A, 220B extend through second primary dielectric layer D2 and are electrically connected to traces 216A, 216B, respectively.

Figure 3:
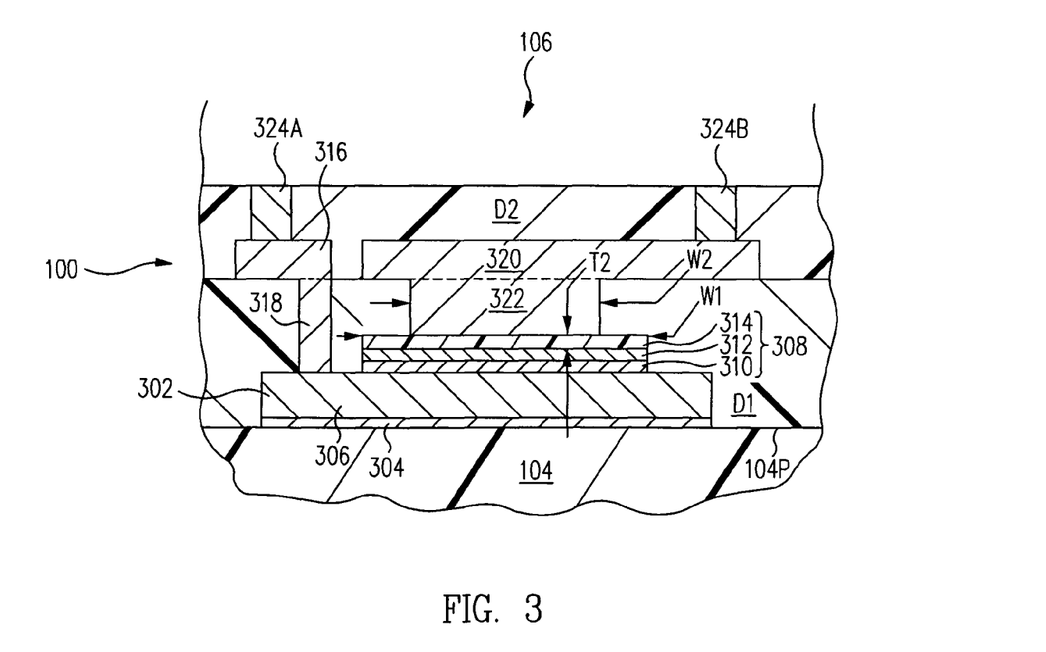
FIG. 3 is an enlarged cross-sectional view of the region III including a capacitor of the passive device structure of FIG. 1 in accordance with one embodiment of the present invention.

FIG. 3 is an enlarged cross-sectional view of the region III including capacitor 106, e.g., a copper/tantalum pentoxide/copper capacitor, of passive device structure 100 of FIG. 1 in accordance with one embodiment of the present invention. Referring now to FIGS. 1 and 3 together, capacitor 106 includes a lower, e.g., first, electrode 302, i.e., a portion of first metal layer M1. More particularly, electrode 302 is electrically conductive and formed directly on principal surface 104P of principal dielectric layer 104 in accordance with this embodiment.

Electrode 302 is a metal bilayer structure. To illustrate, electrode 302 includes a lower, e.g., first, metal layer 304 and an upper, e.g., second, metal layer 306. Illustratively, lower metal layer 304 is formed directly on principal surface 104P of principal dielectric layer 104 and upper metal layer 306 is formed directly on lower metal layer 304.

For example, lower metal layer 304 is formed of titanium and upper metal layer 306 is formed of copper. In accordance with this example, lower metal layer 304 improves adhesion of upper metal layer 306 to principal dielectric layer 104. Further, lower metal layer 304 getters oxygen and prevents migration of the copper of upper metal layer 306 into principal dielectric layer 104.

In other examples, lower metal layer 304 is formed of other materials. For example, lower metal layer 304 is formed of titanium tungsten (TiW). In another example, lower metal layer 304 is formed of a metal stack such as a titanium nitride/aluminum (TiN/Al) or titanium/copper (Ti/Cu) bilayer.

However, in another embodiment, lower metal layer 304 is not formed. In accordance with this example, upper metal layer 306 is formed directly on principal dielectric layer 104.

Formed on electrode 302 is a dielectric structure 308. In accordance with this embodiment, dielectric structure 308 is a trilayer structure including a lower metal layer 310, a middle metal layer 312 on lower metal layer 310, and an upper dielectric layer 314 on middle metal layer 312.

Lower metal layer 310 is titanium or titanium tungsten in accordance with one embodiment. For simplicity of discussion, lower metal layer 310 is hereinafter referred to as titanium layer 310. Titanium layer 310 promote adhesion of middle metal layer 312 to electrode 302.

Middle metal layer 312, sometimes called an anodic metal layer, is an anodic metal, e.g., aluminum, niobium, titanium, tungsten, zirconium or tantalum in accordance with one embodiment. In one specific example, middle metal layer 312 is tantalum. For simplicity of discussion, middle metal layer 312 is hereinafter referred to as tantalum layer 312.

Upper dielectric layer 314 is a metal oxide of the anodic metal of middle metal layer 312, e.g., is aluminum oxide (e.g., $Al_2O_3$), niobium oxide (e.g., $Nb_2O_5$, sometimes called niobium pentoxide), titanium oxide (e.g., $TiO_2$, sometimes called titanium dioxide), tungstic oxide (e.g., $WO_3$, sometimes called tungsten oxide), zirconium oxide (e.g., $ZrO_2$), tantalum oxide (e.g., $Ta_2O_5$, sometimes called tantalum pentoxide). In one specific example, upper dielectric layer 314 is tantalum pentoxide.

For simplicity of discussion, upper dielectric layer 314 is hereinafter referred to as tantalum pentoxide layer 314. Tantalum pentoxide layer 314 sets the degree of electrostatic field coupling of dielectric structure 308 and thus the Q-value of capacitor 106. More particularly, the thickness T2 of tantalum pentoxide layer 314 sets the degree of electrostatic field coupling of dielectric structure 308 and thus the Q-value of capacitor 106. Tantalum pentoxide layer 314 as a dielectric provides a capacity of about 130 nF/cm² for a $V_{BD}$ of around 20 VDC.

As set forth further below, the amount of tantalum layer 312 converted to tantalum pentoxide layer 314 is precisely controlled by the applied anodization potential. Accordingly, thickness T2 of tantalum pentoxide layer 312 is precisely controlled allowing the Q-value of capacitor 106 to be precisely set. Further, the tolerance in the Q-value of capacitor 106 is minimal.

It another embodiment, dielectric structure 308 is a bilayer structure. For example, titanium layer 310 is not formed and tantalum layer 312 is directly formed on electrode 302. In another example, all of the tantalum is oxidized to tantalum pentoxide and accordingly dielectric structure 308 is formed without tantalum layer 312. In accordance with this example, tantalum pentoxide layer 314 is formed directly on titanium layer 310.

Electrode 302 and dielectric structure 308 are enclosed in and covered by first primary dielectric layer D1. An electrically conductive trace 316 is formed on first primary dielectric layer D1. Trace 316 is a portion of second metal layer M2.

An electrically conductive via 318 extends through first primary dielectric layer D1 between electrode 302 and trace 316. Accordingly, via 318 electrically connects electrode 302 and trace 316.

An upper electrode trace 320 is also formed on first primary dielectric layer D1. Upper electrode trace 320 is a portion of second metal layer M2. An upper electrode 322 extends through first primary dielectric layer D1 between upper electrode trace 320 and dielectric structure 308. Although upper electrode trace 320 and upper electrode 322 are described herein as being separate pieces connected together, in another embodiment, upper electrode trace 320 and upper electrode 322 are integral.

In various examples, upper electrode trace 320 and/or upper electrode 322 include a bilayer of: (1) titanium or titanium tungsten; and (2) aluminum, copper, nickel, or other conductor.

Upper electrode 322 is formed on and contacts tantalum pentoxide layer 314 of dielectric structure 308. As tantalum pentoxide layer 314 is a dielectric layer and is between upper electrode 322 and lower electrode 302, tantalum pentoxide layer 314 electrically isolates upper electrode 322 from lower electrode 302 including tantalum layer 312 and titanium layer 310 thus forming capacitor 106.

To avoid shorting of upper electrode 322 with lower electrode 302, tantalum layer 312 or titanium layer 310, dielectric structure 308 is formed with a first width W1 greater than a second width W2 of upper electrode 322. This allows greater flexibility in the placement of upper electrode 322 with respect to dielectric structure 308. To illustrate, upper electrode 322 can be offset slightly to the right or left in FIG. 3 and still be formed entirely upon tantalum pentoxide layer 314. In this manner, the yield of passive device structure 100 is maximized. Further, lower tolerances, e.g., in mask placement, can be used to manufacture passive device structure 100 minimizing manufacturing cost.

As set forth above, lower electrode 302 includes upper metal layer 306, e.g., copper, which is a relatively good electrical conductor. By forming lower electrode 302 of copper in accordance with this embodiment, the performance of capacitor 106 is maximized, e.g., capacitor 106 can be rapidly charged and discharged.

Formed on first primary dielectric layer D1 and covering second metal layer M2 including trace 316 and upper electrode trace 320 is second primary dielectric layer D2. Electrically conductive vias 324A, 324B extend through second primary dielectric layer D2 and are electrically connected to traces 316, 320, respectively.

Referring again to FIG. 1, inductor 110, e.g., a copper inductor with cross under, includes a lower cross under 114, e.g., formed in (a portion of) first metal layer M1. Lower cross under 114 is similar in structure to lower electrode 302 of capacitor 106, and so is not discussed in detail. Inductor 110 includes traces 116A, 116B on first primary dielectric layer D1. Traces 116A, 116B are formed in (portions of) second metal layer M2. Vias 118A, 118B electrically connect traces 116A, 116B with lower cross under 114. Traces 116A, 116B are electrically connected to electrically conductive vias (not shown in the view of FIG. 1) extending through second primary dielectric layer D2.

Inductor 110 further includes a conductor 120, e.g., also formed in second metal layer M2. Although inductor 110 is described above and illustrated as being formed in second metal layer M2 with lower cross under 114 in first metal layer M1, in another embodiment, inductor 110 is formed in first metal layer M1 with an upper cross over in second metal layer M2 similar to lower cross under 114.

Referring still to FIG. 1, capacitor 112, e.g., a copper/BCB/copper capacitor or a copper/polyimide/copper capacitor, is similar to capacitor 106 in some respects. More particularly, capacitor 112 includes a lower electrode 302-1, a trace 316-1, a via 318-1, an upper electrode trace 320-1, vias 324A-1, 324B-1 similar to lower electrode 302, trace 316, via 318, upper electrode trace 320, vias 324A, 324B of capacitor 106, respectively. However, in accordance with this embodiment, upper electrode trace 320-1 forms the upper electrode of capacitor 112. Further, first primary dielectric layer D1 forms the dielectric between upper electrode trace 320-1 and lower electrode 302-1. In one embodiment, first primary dielectric layer D1 is a bisbenzocyclobutene (BCB) layer. The BCB layer is a dielectric providing a capacity of about 0.5 nF/cm$^2$. In other embodiments, first primary dielectric layer D1 is polyimide or other polymeric material.

Figure 4:
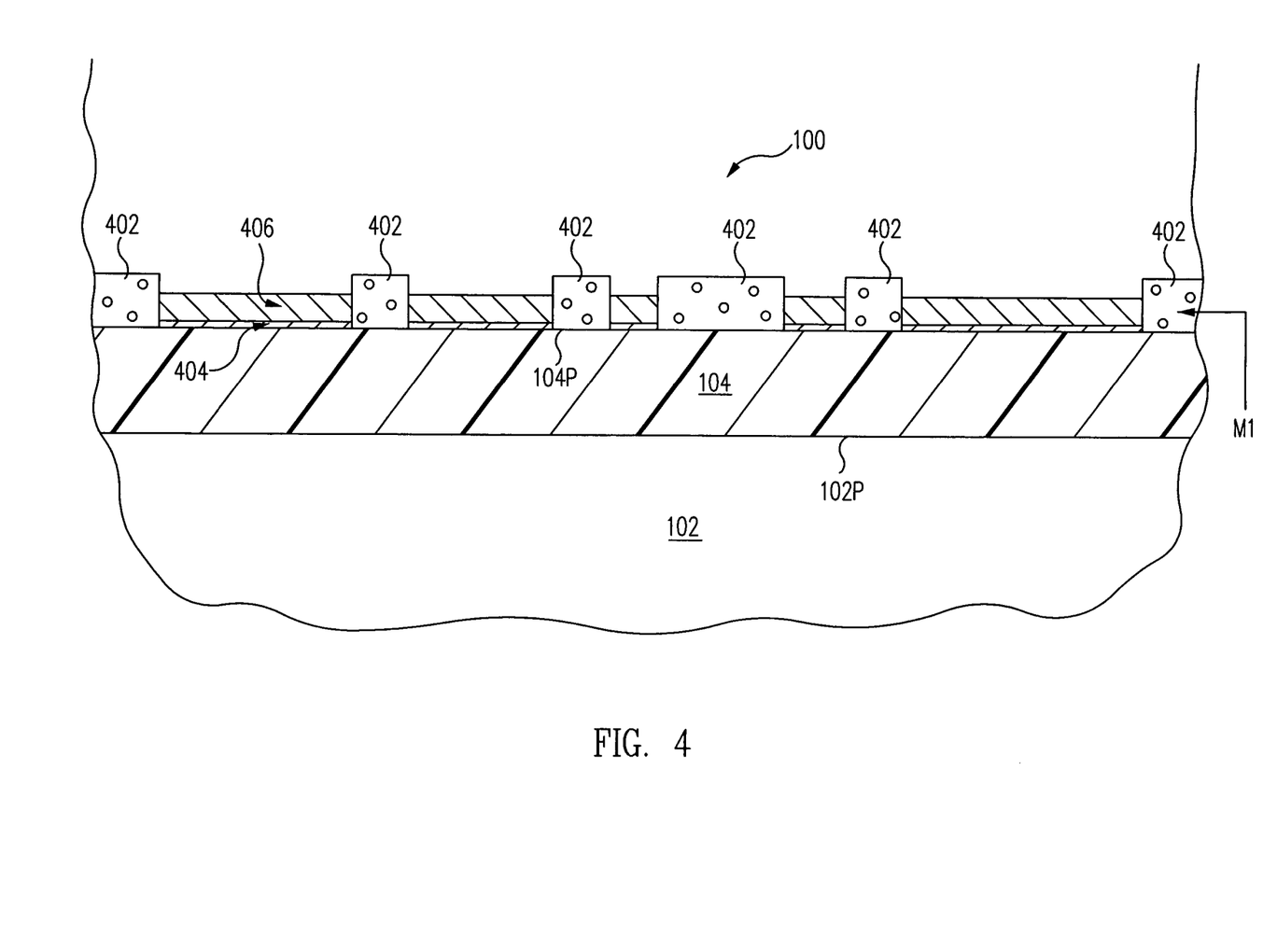
FIG. 4 is a cross-sectional view of the passive device structure of FIG. 1 during fabrication in accordance with one embodiment of the present invention.

FIG. 4 is a cross-sectional view of passive device structure 100 of FIG. 1 during fabrication in accordance with one embodiment of the present invention. Referring now to FIG. 4, a first metal layer mask 402 is formed, e.g., using a positive or negative photoresist and imaging technique as those of skill in the art will understand. First metal layer mask 402 covers first portions of principal dielectric layer 104 and leaves second portions of principal dielectric layer 104 exposed.

First metal layer M1 is selectively formed on the exposed second portions of principal dielectric layer 104. In one embodiment, a titanium layer 404 is initially formed on the exposed second portions of principal dielectric layer 104. A copper layer 406 is then formed on titanium layer 404. First metal layer mask 402 is then removed, e.g., using a wet removal process.

In one embodiment, titanium layer 404 and copper layer 406 cover first metal layer mask 402. The portions of titanium layer 404 and copper layer 406 on first metal layer mask 402 are removed (lifted off) during removal of first metal layer mask 402, e.g., using a wet removal process. This process is sometimes called a lift off process. In other examples, layer 404 is formed of other materials. For example, layer 404 is formed of titanium tungsten (TiW). In another example, layer 404 is formed of a metal stack such as a titanium nitride/aluminum (TiN/Al) or titanium/copper (Ti/Cu) bilayer.

Referring now to FIGS. 1 and 4 together, the patterned first metal layer M1 provides the lower electrode for all capacitor, e.g., capacitors 106, 112. More particularly, the patterned first metal layer M1 forms lower electrodes 302, 302-1 of capacitors 106, 112, respectively.

Further, the patterned first metal layer M1 provides the contacts for all resistors, e.g., resistor 108. More particularly, the patterned first metal layer M1 forms contacts 202A, 202B for resistor 108.

Further, the patterned first metal layer M1 provides the lower cross under for all inductors, e.g., inductor 110. More particularly, the patterned first metal layer M1 forms lower cross under 114 for inductor 110. Although not shown, inductors are also formed in the patterned first metal layer M1 in one embodiment. Further, the patterned first metal layer M1 provides a first level redistribution and routing in one embodiment.

In another embodiment, first metal layer M1 is blanket deposited and then patterned. Illustratively, titanium layer 404 is initially formed on the entire principal surface 104P of principal dielectric layer 104. Copper layer 406 is then formed on titanium layer 404. Using a first mask essentially the opposite of first metal layer mask 402 shown in FIG. 4, the first metal layer M1, i.e., the titanium copper stack (titanium layer 404 and copper layer 406), is etched. The first mask is then removed.

In another embodiment, an electrically conductive seed layer, e.g., titanium layer 404 or a titanium/copper bilayer, and first mask are used to selectively deposit copper layer 406. To illustrate, titanium layer 404 is initially formed on the entire principal surface 104P of principal dielectric layer 104. A first mask substantially similar to first metal layer mask 402 shown in FIG. 4 is formed on titanium layer 404. Copper layer 406 is then electrochemically deposited on the exposed portions of titanium layer 404. The first mask is removed, and the exposed portions of titanium layer 404 are etched using copper layer 406 as a mask.

In another embodiment, titanium layer 404 is not formed and first metal layer M1 is copper layer 406 only.

Figure 5:
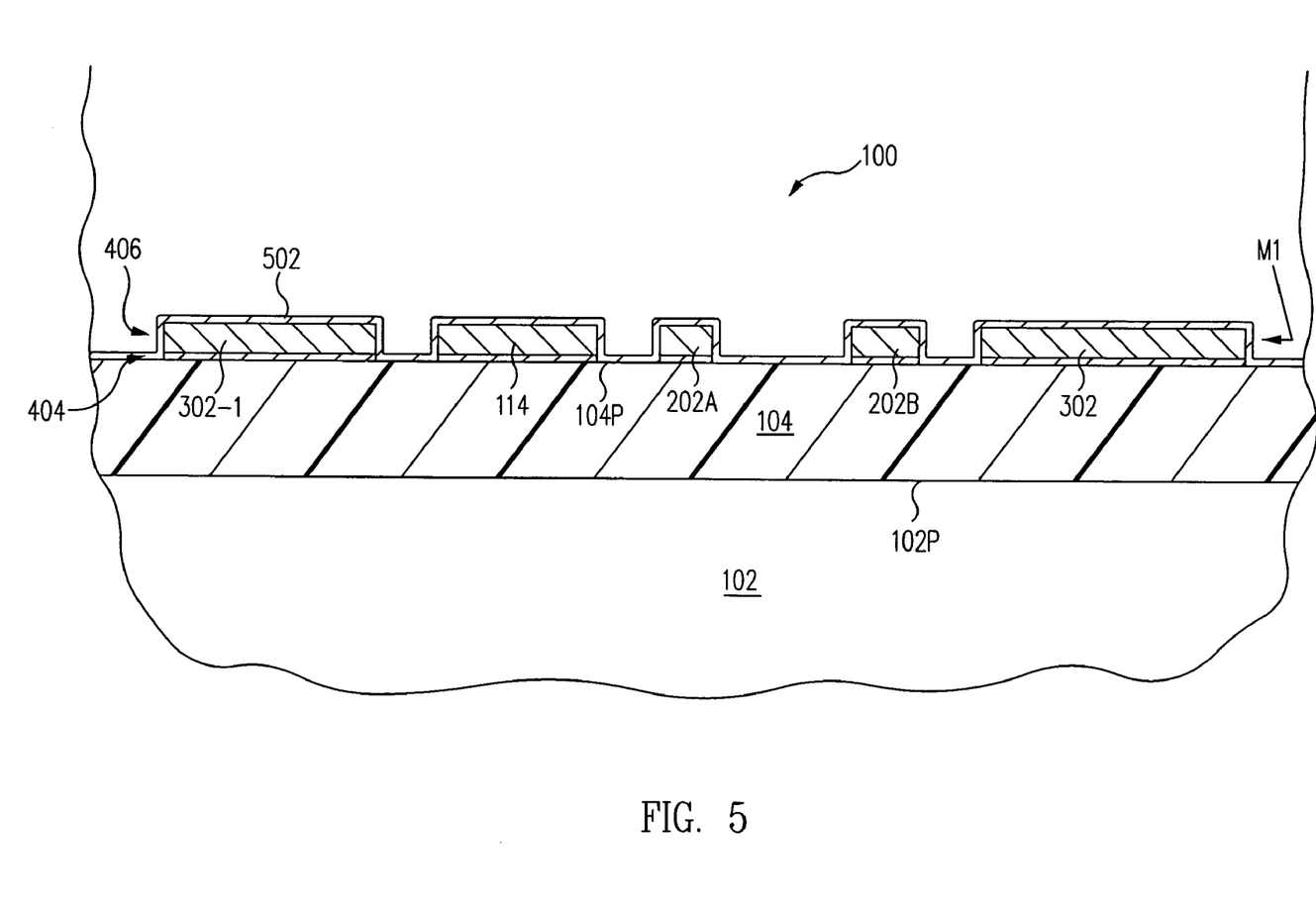
FIGS. 5, 6, 7, 8, 9 are cross-sectional views of the passive device structure of FIG. 4 at later stages during fabrication in accordance with various embodiments of the present invention.

FIG. 5 is a cross-sectional view of passive device structure 100 of FIG. 4 at a later stage during fabrication in accordance with one embodiment of the present invention. Referring now to FIG. 5, a titanium layer 502 (or a titanium tungsten layer) is blanket deposited, e.g., by sputtering, to cover first metal layer M1 and the exposed portions of principal dielectric layer 104.

Formation of titanium layer 502 is optional, and in one embodiment, is not performed. In accordance with this embodiment, fabrication proceeds directly from the stage illustrated in FIG. 4 to the stage illustrated in FIG. 6 without titanium layer 502.

FIG. 6 is a cross-sectional view of passive device structure 100 of FIG. 5 at a later stage during fabrication in accordance with one embodiment of the present invention. Referring now to FIG. 6, an anodic metal layer such as an aluminum layer, a niobium layer, a titanium layer, a tungsten layer, a zirconium layer or a tantalum layer is formed. In one specific example, a tantalum layer 602 is blanket deposited, e.g., by sputtering, to cover titanium layer 502 (or first metal layer M1 and the exposed portions of principal dielectric layer 104 in the case that titanium layer 502 is not formed). In one embodiment, tantalum layer 602 is deposited using DC magnetron sputtering in argon at a pressure 5 mTorr. In one embodiment, the thickness of tantalum layer 602 is less than 250 nm.

FIG. 7 is a cross-sectional view of passive device structure 100 of FIG. 6 at a later stage during fabrication in accordance with one embodiment of the present invention. Referring now to FIG. 7, an anodization mask 702 is formed, e.g., using positive or negative photoresist and imaging techniques. Anodization mask 702 covers portions of tantalum layer 602 that will be later removed as discussed in more detail with reference to FIG. 8. Further, anodization mask 702 leaves exposed portions of tantalum layer 602 that are to be anodized to tantalum pentoxide. Generally, anodization mask 702 leaves exposed portions of the anodic metal layer that are to be anodized to metal oxides of the metal of the anodic metal layer.

After formation of anodization mask 702, anodization of the exposed portions of tantalum layer 602 is performed. In one embodiment, anodization is performed in a 1% aqueous ammonium tartrate electrolyte at room temperature. Further, a separate silicon wafer is used as the counter electrode as the current density is only 1 mA/cm$^2$ in one embodiment.

As the oxygen diffusing into the growing tantalum pentoxide is self-limited by the applied anodization potential, the thickness of the final tantalum pentoxide layer can be accurately defined by setting the applied anodization potential at a specific compliance voltage, e.g., 80 volts for a resulting tantalum pentoxide thickness of approximately 120 nm. Illustratively, the proportionality constant for the tantalum pentoxide growth is in the range of 14.7 Å/V to 17 Å/V. The anodization of tantalum to tantalum pentoxide reaches the end point automatically and the current drops off rapidly once the compliance voltage is reached. In one embodiment, the compliance voltage is about four times the rated breakdown voltage of the tantalum pentoxide formed.

The anodic half cell reactions are:

$$2Ta \rightarrow 2Ta^{5+} + 10e^-$$

$$2Ta^{5+} + 10OH^- \rightarrow Ta_2O_5 + 5H_2O$$

and the cathodic half cell reaction is:

$$10H_2O + 10e^- \rightarrow 5H_{2(g)} + 10OH^-$$

The tantalum pentoxide film is transparent and has an interference color depending upon the thickness. For example, the interference color is purple for a tantalum pentoxide thickness around 110 nm to light green for a tantalum pentoxide thickness of a around 150 nm. When measuring the tantalum pentoxide thickness, it is noted that the density of the tantalum pentoxide is about half of the density of the tantalum (8.2 gm/cm$^3$ versus 16.6 gm/cm$^3$). Accordingly, the tantalum pentoxide grows into as well as out of the tantalum and about one-third of the tantalum pentoxide is below the level of the original tantalum.

The tantalum content of the tantalum pentoxide is about 82 percent by weight. Thus, a 120 nm tantalum pentoxide film will consume about 48 nm of tantalum.

Accordingly, referring still to FIG. 7, anodization of the exposed portions, sometimes called exposed first portion, of tantalum layer 602 forms a tantalum pentoxide layer 704. More particularly, anodization of the exposed portions of tantalum layer 602 forms resistive structure 208 and dielectric structure 308 as discussed above.

The exposed portions of tantalum layer 603 are partially anodized (only partially converted to tantalum pentoxide with some of the original tantalum remaining) in one embodiment resulting in a trilayer structure for resistive structure 208 and dielectric structure 308. More particularly, as shown in FIG. 2, resistive structure 208 includes titanium layer 210, tantalum layer 212, and tantalum pentoxide layer 214 in accordance with this embodiment. Similarly, as shown in FIG. 3, dielectric structure 308 includes titanium layer 310, tantalum layer 312, and tantalum pentoxide layer 314.

The exposed portions of tantalum layer 602 are partially anodized (only partially converted to tantalum pentoxide with some of the original tantalum remaining) in one embodiment resulting in a trilayer structure for resistive structure 208 and dielectric structure 308. More particularly, as shown in FIG. 2, resistive structure 208 includes titanium layer 210, tantalum layer 212, and tantalum pentoxide layer 214 in accordance with this embodiment. Similarly, as shown in FIG. 3, dielectric structure 308 includes titanium layer 310, tantalum layer 312, and tantalum pentoxide layer 314.

In another embodiment, the exposed portions of tantalum layer 602 are completely anodized (entirely converted to tantalum pentoxide such that none of the original tantalum remains) resulting in a bilayer structure for resistive structure 208 and dielectric structure 308. In accordance with this embodiment, resistive structure 208 is formed without tantalum layer 212 (FIG. 2). Similarly, dielectric structure 308 is formed without tantalum layer 312 (FIG. 3). Titanium layer 502 operates as the anodization stop.

Anodization mask 702 is then removed, e.g., using a wet removal process.

In another embodiment, a conductive material such as manganese dioxide (MnO$_2$), which decomposes into a dielectric material once a threshold temperature has been reached, is applied to tantalum pentoxide layer 704. To the extent that there are any pinhole defects in tantalum pentoxide layer 704, the conductive material decomposes during any short circuit through the pinhole defect, thus healing the pinhole defect. Such a process is described in Rinne, U.S. patent application Ser. No. 11/365,768, filed on Mar. 1, 2006, entitled "METHODS FOR FORMING SELF-HEALING METAL-INSULATOR-METAL (MIM) STRUCTURES AND RELATED DEVICES", which is herein incorporated by reference in its entirety. However, the application of the conductive material is optional and in one embodiment is not performed.

FIG. 8 is a cross-sectional view of passive device structure 100 of FIG. 7 at a later stage during fabrication in accordance with one embodiment of the present invention. Referring now to FIGS. 7 and 8 together, tantalum pentoxide layer 704 is used as an etch mask for etching of (removal) the exposed portions, i.e., those portions not covered by tantalum pentoxide layer 704, of tantalum layer 602. Specifically, the second portions of tantalum layer 602 which were covered with anodization mask 702 as illustrated in FIG. 7 are now the exposed portions of tantalum layer 602. These portions of tantalum layer 602 are removed as shown in FIG. 8.

Illustratively, a reactive ion etch (RIE) process is used. Illustratively parameters for the RIE process are 100 sccm CF$_4$ at 100 mTorr and 1,000 W, with an expected etch selectivity of tantalum over tantalum pentoxide being about 3:1. In another embodiment, chlorotrifluoromethane (CF$_3$C1), sometimes called refrigerant CFC-13, is used with an expected etch selectivity of tantalum over tantalum pentoxide being about 60:1.

In the embodiment where titanium layer 502 is formed, the exposed portions of titanium layer 502 are also etched (removed) using tantalum pentoxide layer 704 as an etch mask, e.g., using a wet removal process. By using tantalum pentoxide layer 704 as an etch mask, formation of an additional etch mask, e.g., from photoresist, is avoided. This simplifies manufacturing and minimizes the manufacturing cost of passive device structure 100.

Figure 9:
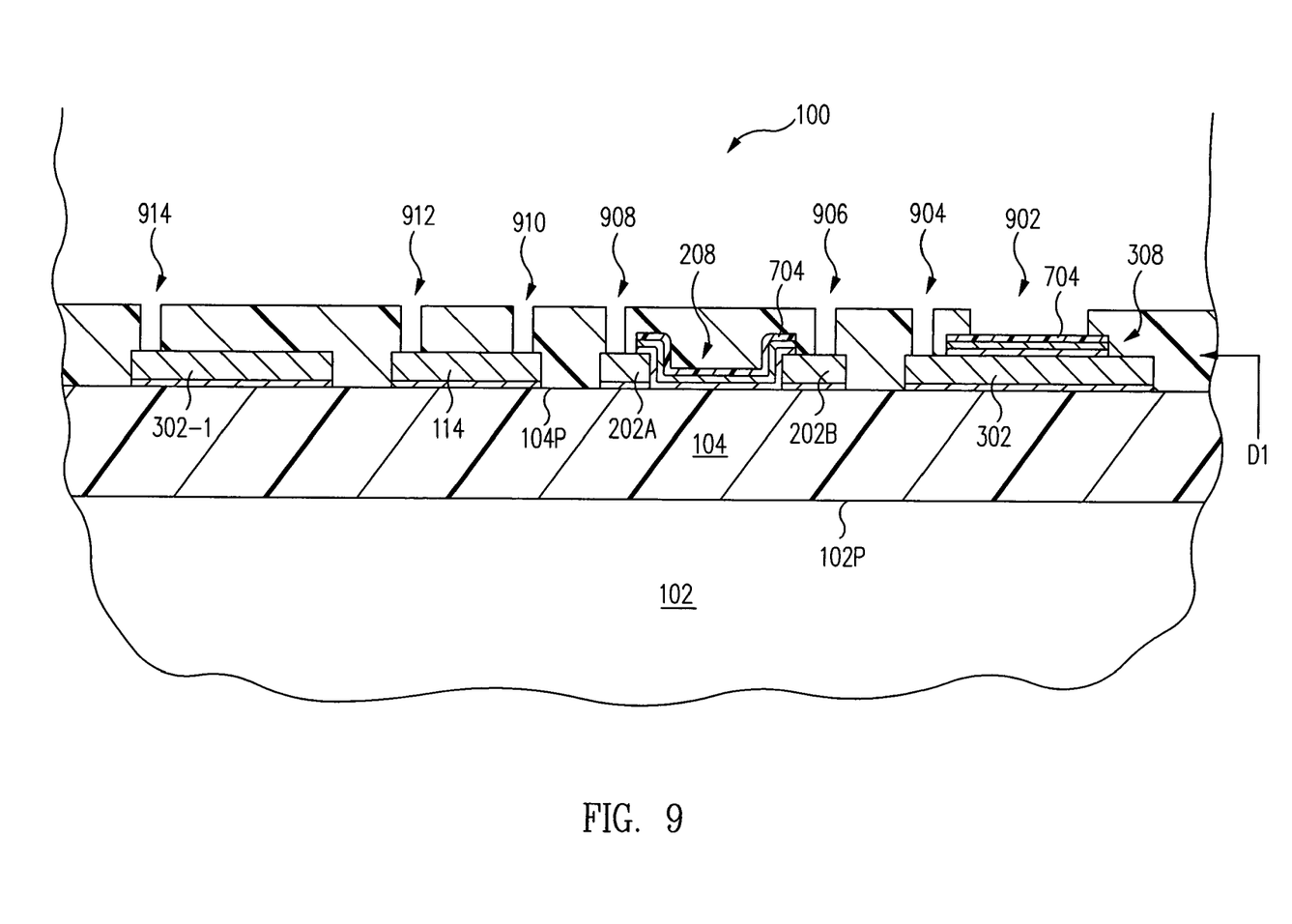

FIG. 9 is a cross-sectional view of passive device structure 100 of FIG. 8 at a later stage during fabrication in accordance with one embodiment of the present invention. Referring now to FIG. 9, first primary dielectric layer D1 is formed and patterned to form vias therein. Illustratively, a BCB layer is blanket deposited. The BCB layer is patterned, e.g., by etching the BCB layer using a photoresist mask or by using a photosensitive BCB layer and imaging technique, to form vias extending through the BOB layer. In another embodiment, primary dielectric layer D1 is polyimide or other polymeric material.

As shown in FIG. 9, first primary dielectric layer D1 entirely covers tantalum pentoxide layer 704 to protect against shorting across the sides of tantalum pentoxide layer 704. More particularly, first primary dielectric layer D1 entirely encloses resistive structure 208 and dielectric structure 308.

First primary dielectric layer D1 is patterned to form vias 902, 904 extending to lower electrode 302, dielectric structure 308 of capacitor 106. Further, first primary dielectric layer D1 is patterned to form vias 906, 908 extending to contacts 202B, 202A of resistor 108. Further, first primary dielectric layer D1 is patterned to form vias 910, 912 extending to lower cross under 114 of inductor 110. Further, first primary dielectric layer D1 is patterned to form via 914 extending to lower electrode 302-1 of capacitor 112.

Referring now to FIGS. 9 and 1 together, vias 902, 904, 906, 908, 910, 912, 914 are filled or lined with an electrically conductive material, e.g., copper, to form upper electrode 322, via 318, via 218B, via 218A, via 118B, via 118A, and via 318-1. In one embodiment, traces 320, 316, 216B, 216A, 116B, 116A, 316-1 are formed simultaneously and integral with upper electrode 322, via 318, via 218B, via 218A, via 118B, via 118A, via 318-1, respectively. Further, upper electrode trace 320-1 is formed at the same time in accordance with this embodiment.

Any one of a number of techniques are used to pattern the electrically conductive material, e.g., copper. In one example, an electroplating process is used. In another example, a copper lift off process is used.

Referring now to FIG. 1, second primary dielectric layer D2 is deposited and patterned to form vias through second primary dielectric layer D2. Second primary dielectric layer D2 is deposited and patterned in a manner similar to that discussed above regarding first primary dielectric layer D1, and so is not repeated here. Finally, the vias of second dielectric layer are filled, e.g., using a copper lift off process similar to that discussed above. This forms vias 220B, 220A, 324B, 324A, 324A-1, 324B-1.

As set forth above, passive device structure 100 is formed using four mask levels, i.e., first metal layer mask 402 (FIG. 4), anodization mask 702 (FIG. 7), and the first and second lift off masks and one electrochemical operation, e.g., anodization of tantalum layer 602 to tantalum pentoxide layer 704 (FIG. 7). As only four mask levels are used, the process is relatively simple and thus passive device structure 100 is formed with a high yield and low manufacturing cost.

In one embodiment, electrically conductive bumps formed during the repassivation process are not placed over capacitor 106 or resistor 108.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A passive device structure comprising a capacitor, the capacitor comprising:
   a first electrode;
   a second electrode; and
   a dielectric structure comprising a conductive layer and a dielectric layer between the first electrode and the second electrode, the dielectric layer comprising a metal oxide selected from the group consisting of aluminum oxide, niobium oxide, titanium oxide, tungstic oxide, zirconium oxide, and tantalum oxide, wherein the dielectric structure has a first width greater than a second width of the second electrode, the passive device structure further comprising a resistor, the resistor comprising:
   a first contact;
   a second contact, wherein the first electrode, the first contact, and the second contact are portions of a first metal layer;
   a resistive structure electrically connected to the first contact and the second contact, the resistive structure comprising:
   a conductive layer; and
   a dielectric layer comprising a metal oxide selected from the group consisting of aluminum oxide, niobium oxide, titanium oxide, tungstic oxide, zirconium oxide, and tantalum oxide.

2. The passive device structure of claim 1 wherein the conductive layer of the resistive structure comprises tantalum.

3. The passive device structure of claim 1 wherein the conductive layer of the resistive structure comprises titanium.

4. The passive device structure of claim 1 wherein the resistive structure is a trilayer structure comprising:
   the conductive layer of the resistive structure;
   an anodic metal layer comprising an anodic metal on the conductive layer of the resistive structure; and
   the dielectric layer of the resistive structure on the anodic metal layer, the metal oxide of the resistive structure being an oxide of the anodic metal.

5. The passive device structure of claim 1 further comprising a first primary dielectric layer enclosing the contacts and the resistive structure.

6. The passive device structure of claim 1 wherein the conductive layer of the dielectric structure comprises tantalum.

7. The passive device structure of claim 1 wherein the conductive layer of the dielectric structure comprises titanium.

8. The passive device structure of claim 1 wherein the dielectric structure is a trilayer structure comprising:
   the conductive layer;
   an anodic metal layer comprising an anodic metal on the conductive layer; and
   the dielectric layer on the anodic metal layer, the metal oxide being an oxide of the anodic metal.

9. The passive device structure of claim 1 wherein the first electrode and the second electrode comprise copper.

10. The passive device structure of claim 1 further comprising a first primary dielectric layer enclosing the first electrode and the dielectric structure.

11. The passive device structure of claim 1 further comprising a second capacitor, the second capacitor being selected from the group consisting of a copper/polyimide/copper capacitor and a copper/bisbenzocyclobutene/copper capacitor.

12. The passive device structure of claim 1 further comprising an inductor.

13. A passive device structure comprising a capacitor, a resistor, and an inductor, the capacitor comprising:
   a first electrode;
   a second electrode; and
   a dielectric structure comprising a conductive layer and a dielectric layer between the first electrode and the second electrode, the dielectric layer comprising a metal oxide selected from the group consisting of aluminum oxide, niobium oxide, titanium oxide, tungstic oxide, zirconium oxide, and tantalum oxide,
   the inductor comprising:
   a cross under;
   the resistor comprising:
   a first contact;
   a second contact, wherein the first electrode, the first contact, the second contact, and the cross under are portions of a first metal layer.

14. The passive device structure of claim 13 wherein the first metal layer is formed on a principal surface of a principal dielectric layer.

15. The passive device structure of claim 13 wherein the inductor further comprises:
   a first trace;
   a first via electrically connecting the first trace to the cross under;
   a second trace; and a second via electrically connecting the second trace to the cross under.

16. The passive device structure of claim 15 wherein the inductor further comprises:
a conductor, wherein the conductor, the first trace and the second trace are portions of a second metal layer.

17. A passive device structure comprising a capacitor, a resistor, and an inductor, the capacitor comprising:
a first electrode;
a second electrode; and
a dielectric structure comprising a conductive layer and a dielectric layer between the first electrode and the second electrode, the dielectric layer comprising a metal oxide selected from the group consisting of aluminum oxide, niobium oxide, titanium oxide, tungstic oxide, zirconium oxide, and tantalum oxide,
the inductor comprising:
a cross under;
a first trace;
a first via electrically connecting the first trace to the cross under;
a second trace;
a second via electrically connecting the second trace to the cross under; and
a conductor,
wherein the resistor comprises:
a first contact;
a second contact;
a resistive structure electrically connected to the first contact and the second contact, the resistive structure comprising:
a conductive layer;
an anodic metal layer comprising an anodic metal on the conductive layer of the resistive structure; and
a dielectric layer on the anodic metal layer, the dielectric layer comprising a metal oxide selected from the group consisting of aluminum oxide, niobium oxide, titanium oxide, tungstic oxide, zirconium oxide, and tantalum oxide,
wherein the conductive layer promotes adhesion of the anodic metal layer to the first contact and the second contact.

18. The passive device structure of claim 17 wherein the first electrode and the cross under are portions of a first metal layer and wherein the conductor, the first trace and the second trace are portions of a second metal layer.

19. The passive device structure of claim 18 wherein the first contact and the second contact are portions of the first metal layer.

* * * * *